US012761269B2

(12) United States Patent
Lou et al.

(10) Patent No.: US 12,761,269 B2
(45) Date of Patent: Oct. 13, 2026

(54) WAFER TESTER AND STORAGE CONTAINER FOR WAFER TESTER

(71) Applicant: VUETTE PTE. LTD., Singapore (SG)

(72) Inventors: Choon Leong Lou, Singapore (SG); Ho Yeh Chen, Hsinchu County (TW); Ban Ban Lim, Singapore (SG)

(73) Assignee: VUETTE PTE. LTD., Singapore (SG)

( * ) Notice: Subject to any disclaimer, the term of this patent is extended or adjusted under 35 U.S.C. 154(b) by 132 days.

(21) Appl. No.: 19/019,498

(22) Filed: Jan. 14, 2025

(65) Prior Publication Data

US 2026/0056251 A1 Feb. 26, 2026

(30) Foreign Application Priority Data

Aug. 23, 2024 (CN) ........................ 202411165168.8

(51) Int. Cl.

*G01R 31/28* (2006.01)
*G01R 1/04* (2006.01)
*G01R 1/073* (2006.01)

(52) U.S. Cl.

CPC ....... *G01R 31/2867* (2013.01); *G01R 1/0491* (2013.01); *G01R 1/07342* (2013.01)

(58) Field of Classification Search

CPC .............. G01R 31/2867; G01R 1/0491; G01R 1/07342; G01R 31/2893; G01R 1/04; G01R 31/28; G01R 31/52

See application file for complete search history.

(56) References Cited

U.S. PATENT DOCUMENTS

2007/0150085 A1* 6/2007 Akiyama ............ H10P 72/0612 700/112
2008/0284455 A1* 11/2008 Obikane ............ G01R 31/2893 324/754.08
2019/0227116 A1* 7/2019 Boduch .............. G01R 31/2831
2021/0278456 A1* 9/2021 Hosaka .............. G01R 31/2889

FOREIGN PATENT DOCUMENTS

JP 2010245437 A 10/2010
JP 2013156084 * 8/2013 ............ G01R 31/26
KR 1998025778 A 7/1998
KR 1020120063711 A 6/2012
KR 1020150138213 A 12/2015
KR 1020180013316 A 2/2018
KR 101948033 B1 2/2019
TW 200935533 A 8/2009
TW 200939295 A 9/2009

OTHER PUBLICATIONS

Japan Patent Office, Office Action issued on Mar. 3, 2026 for JP application No. 2025-012779.
Korea Patent Office, Notice of Allowance issued on Jun. 1, 2026 for KR application No. 1020250033240.

* cited by examiner

*Primary Examiner* — Alvaro E Fortich
(74) *Attorney, Agent, or Firm* — Li & Cai Intellectual Property Office

(57) ABSTRACT

A wafer tester and a storage container for the wafer tester are provided. The wafer tester includes a chuck, a probe card, a storage container, and a conveying device. The probe card is disposed above the chuck with respect to the chuck. The storage container includes a plurality of drawers, and the plurality of drawers are configured for carrying the test sample or an auxiliary device. The conveying device conveys the test sample or the auxiliary device among the chuck, the storage container, and the wafer cassette.

10 Claims, 4 Drawing Sheets

WAFER TESTER AND STORAGE CONTAINER FOR WAFER TESTER

FIELD OF THE DISCLOSURE

The present disclosure relates to a wafer tester and a storage container for the wafer tester, and more particularly to a storage container for storing a wafer and a cleaning sheet, and a wafer tester including the same.

BACKGROUND OF THE DISCLOSURE

In the semiconductor process, probe cards are used to test wafers and chips to ensure the quality of wafers and chips. Specifically, the wafer is placed on the chuck and the tip of the probe is applied to stub the electrode pad to scrape the oxide layer on the electrode pad, whereby the probe can be electrically connected to the electrode pad. As a result, after a period of testing, the tip of the probe is usually contaminated with various metal particles and oxides, which affects the accuracy of the testing results.

In order to remove the residue on the tip of the probe, a cleaning sheet is placed on the chuck in place of the wafer, so that the probe is in contact with the cleaning sheet for probe cleaning. Accordingly, it is necessary to place the wafers in a wafer cassette in advance. The wafer cassette is a device disposed outside the tester to carry and convey the wafers, and typically holds multiple wafers. Through the robotic arm, the wafer to be tested can be transferred from the wafer cassette into the tester, and the tested wafer can be transferred from the tester into the wafer cassette.

Specifically, the robotic arm takes out the wafer to be tested from the wafer cassette and places it on the chuck of the tester, so that the chuck carries the wafer for a burn-in test. When the test is completed, the wafer is unloaded from the chuck and placed back into the wafer cassette through the robotic arm, and the next wafer to be tested is transferred to the chuck for testing.

However, most of the wafer cassettes in the conventional technology are made of thermolabile materials such as plastics. If the wafers at high temperatures are placed back into the wafer cassette, the wafer cassette may melt and stick to the wafers. If it is needed to wait for the wafers to cool before placing them back into the wafer cassette, the overall test time is increased. A similar situation occurs in the low-temperature test.

Therefore, how to improve the testing efficiency of wafer testers through the improvement of structural design to overcome the above defects has become one of the important issues to be addressed in the related field.

SUMMARY OF THE DISCLOSURE

The technical problem to be solved by the present disclosure is to improve the testing efficiency of wafer testers through the improvement of structural design.

In order to solve the above-mentioned problems, one of the technical aspects adopted by the present disclosure is to provide a wafer tester for testing a test sample from a wafer cassette. The wafer tester includes a chuck, a probe card, a storage container, and a conveying device. The probe card is disposed above the chuck with respect to the chuck. The storage container includes a plurality of drawers, and the plurality of drawers are configured for carrying the test sample or an auxiliary device. The conveying device conveys the test sample or the auxiliary device among the chuck, the storage container, and the wafer cassette.

In one of the possible or preferred embodiments, the conveying device removes the test sample from the chuck to unlock the test sample from the chuck, and the conveying device conveys the test sample directly to the drawer of the storage container.

In one of the possible or preferred embodiments, the conveying device removes the auxiliary device from the drawer of the storage container, and conveys the auxiliary device to the chuck.

In one of the possible or preferred embodiments, the auxiliary device is a cleaning sheet, a golden wafer, or an isolation substrate.

In one of the possible or preferred embodiments, the storage container is made of a low-temperature material capable of withstanding at least −40° C.

In one of the possible or preferred embodiments, the storage container is made of a highly thermally conductive material having a thermal conductivity greater than 1.4 W/m·K (Watts per meter Kelvin).

In one of the possible or preferred embodiments, the storage container is made of a high-temperature material capable of withstanding at least 125° C. (degrees Celsius).

In one of the possible or preferred embodiments, the storage container is made of a metal material.

In one of the possible or preferred embodiments, each of the plurality of drawers of the storage container has a first opening and a second opening that are arranged opposite to each other, the conveying device conveys the test sample or the auxiliary device through the first opening, and the second opening is configured for replacing the auxiliary device.

In order to solve the above-mentioned problems, another one of the technical aspects adopted by the present disclosure is to provide a storage container for use in the wafer tester as claimed in claim 1. The storage container includes a plurality of drawers for carrying the test sample or the auxiliary device. Each of the plurality of drawers independently has a first opening configured for removing the test sample or the auxiliary device out or into the storage container, and a second opening arranged opposite to the first opening and configured for replacing the auxiliary device.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
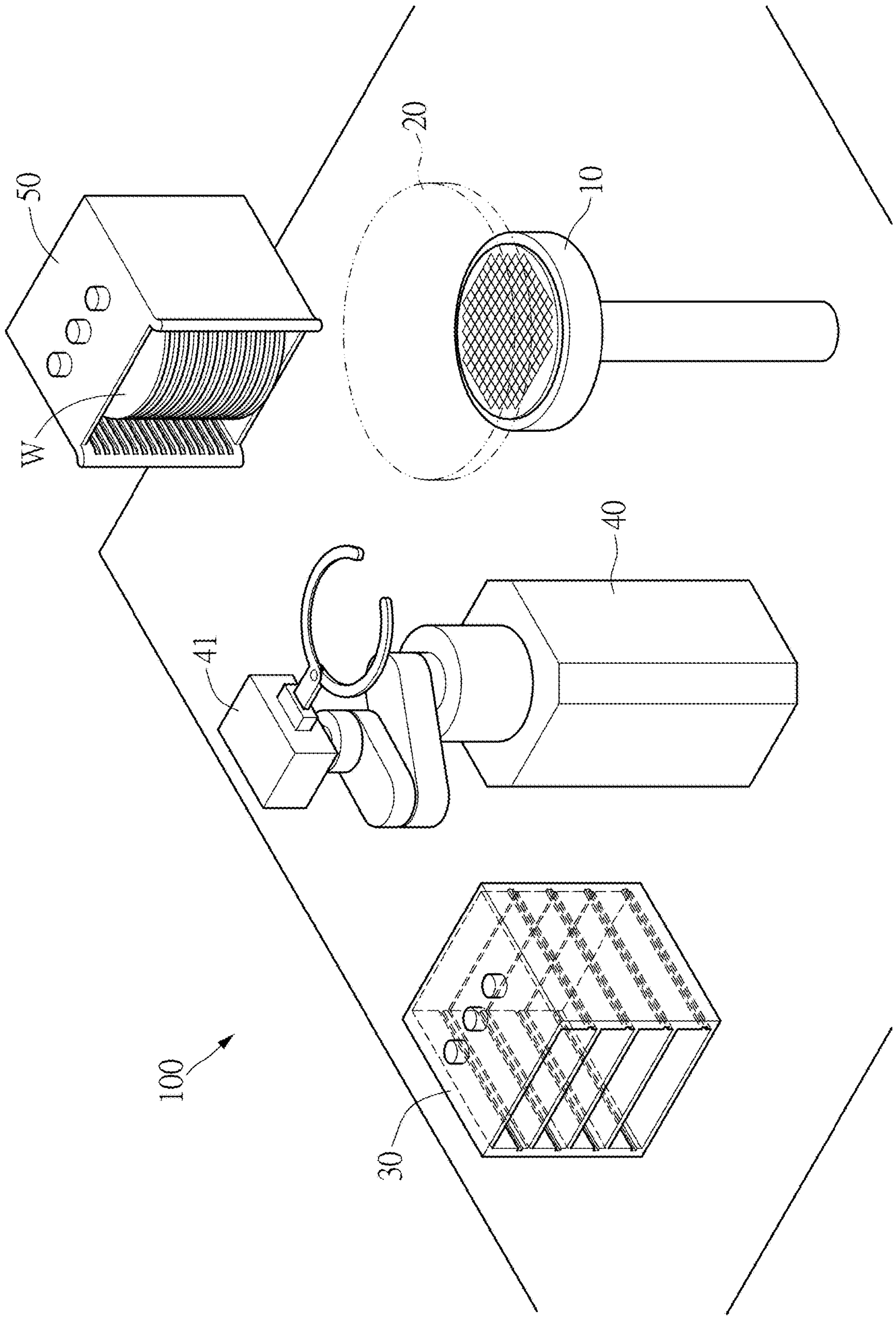
FIG. 1 is a schematic perspective view of a wafer tester according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
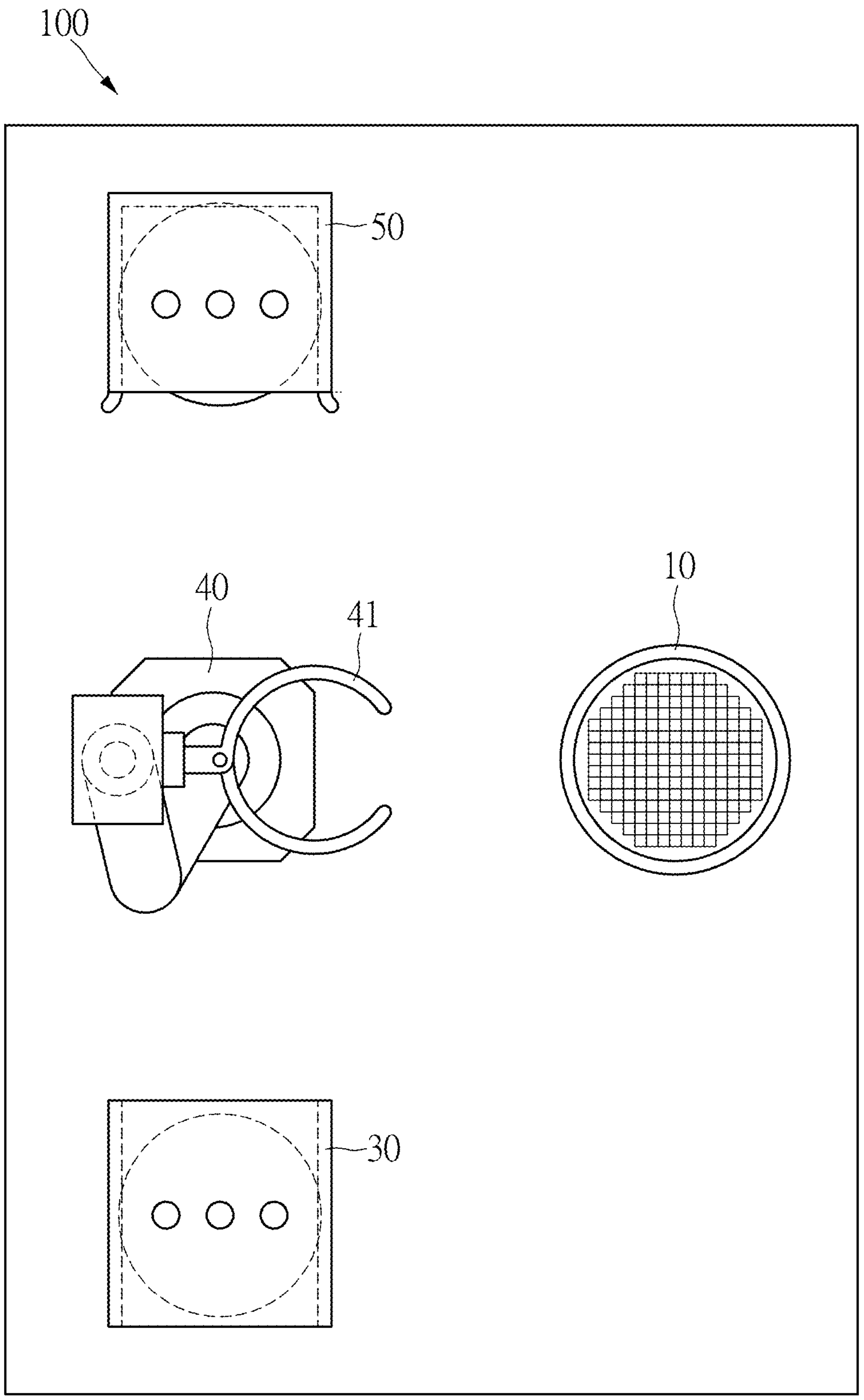
FIG. 2 is a schematic top view of the wafer tester according to the present disclosure.
Figure 3:
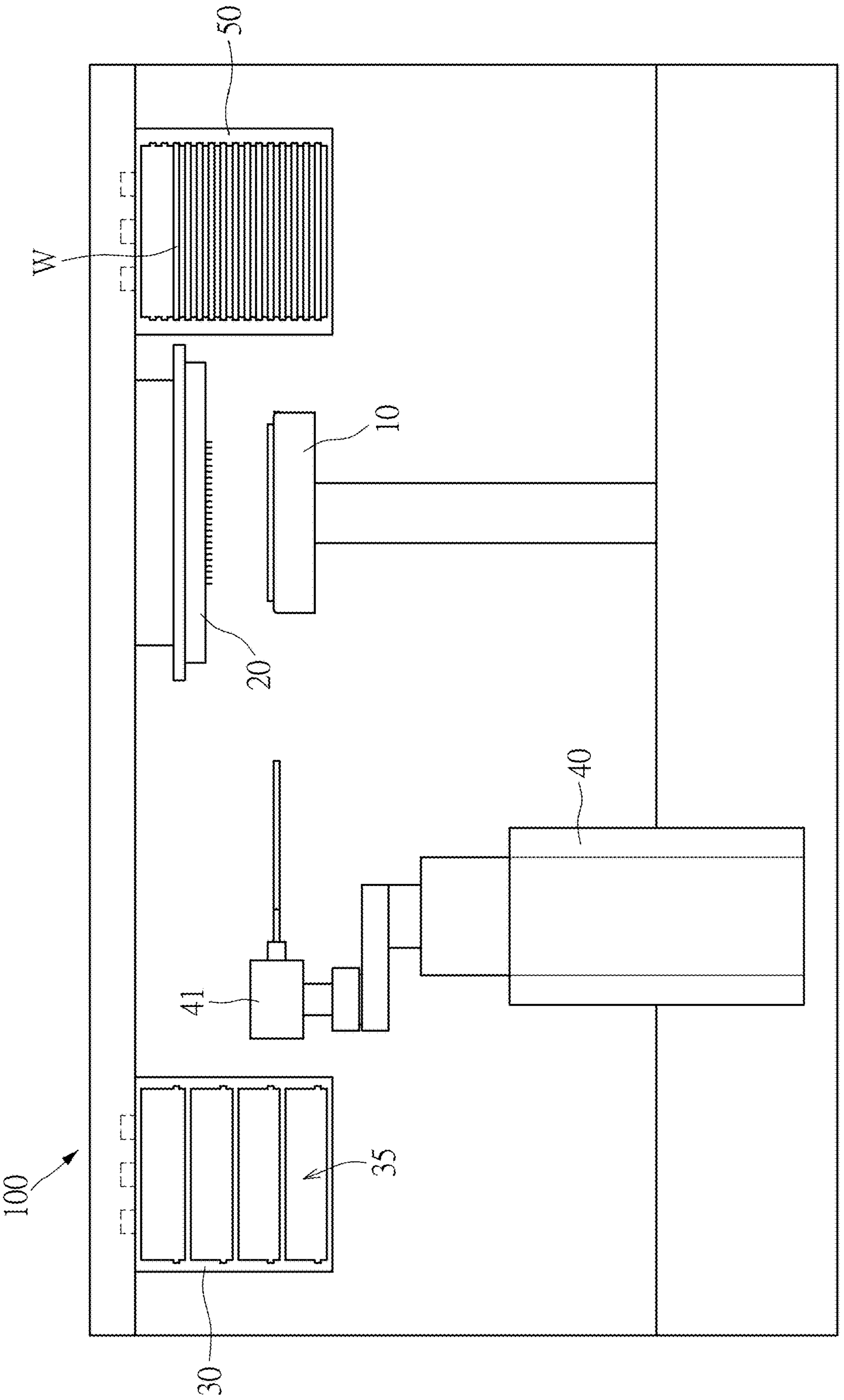
FIG. 3 is a schematic side view of the wafer tester according to the present disclosure.

Reference is made to FIG. 1, FIG. 2, and FIG. 3 that respectively show a schematic perspective view, a schematic top view, and a schematic side view of a wafer tester 100 provided by the present disclosure. The wafer tester 100 of the present disclosure can include a chuck 10, a probe card 20, a storage container 30, and a conveying device 40. The chuck 10 is used to carry a test sample W. The probe card 20 is disposed above the chuck 10 with respect to the chuck 10 so that probes of the probe card 20 can be used to test the test sample W placed on the chuck 10. Generally, wafter reliability testing is performed at a certain high temperature or a certain low temperature. In one embodiment, the chuck 10 can heat the test sample W and the probes can be used to test the test sample W placed on the chuck 10 to perform a burn-in test. In one embodiment, the test sample W is cooled down in the wafer tester 100 and the probes can be used to test the test sample W placed on the chuck 10 to perform a low-temperature wafer testing.

Further, the storage container 30 is arranged adjacent to the chuck 10, the storage container 30 includes multiple drawers 35 for holding auxiliary devices or temporarily storing the test samples W. A wafer cassette 50 for storing the test sample W that is untested and/or tested is provided to cooperate with the wafer tester 100 to enable the wafer tester 100 to perform testing of wafers in the wafer cassette 50. In some embodiments, a section is provided in the wafer tester 100 for placing the wafer cassette 50. For example, the test sample W can be the wafer. However, the present disclosure is not limited thereto. In addition, the conveying device 40 can include a robotic arm 41.

In one embodiment, the conveying device 40 can be disposed between the chuck 10 and the storage container 30 so that the conveying device 40 can convey the test samples W or the auxiliary devices between the chuck 10 and the storage container 30. Further, the chuck 10, the storage container 30, and the wafer cassette 50 can be disposed around the conveying device 40, so that the conveying device 40 can convey the test samples W or the auxiliary devices among the chuck 10, the storage container 30, and the wafer cassette 50. In the present embodiment, the conveying device 40, the chuck 10, the storage container 30, and the wafer cassette 50 are all disposed in the wafer tester 100 of the present disclosure, whereby only one conveying device 40 can be used to convey the test samples W or the auxiliary devices among the chuck 10, the storage container 30, and the wafer cassette 50.

In one embodiment, whether or not probing of the probe card 20 (i.e., alignment) is correct, a needle pressure of the probe is as expected, and an over drive of the probe is normal can be verified before testing the test sample W. In the present embodiment, the auxiliary device can be placed in the storage container 30, and the auxiliary device can be a test sheet. The conveying device 40 can remove the test sheet from the drawer 35 of the storage container 30 and convey the test sheet to the chuck 10 to perform a probe contact check. After adjustment, the test sheet is unloaded from the chuck 10 using the conveying device 40 and returned to the storage container 30.

It is worth mentioning that in the conventional technology, a golden wafer is needed to be fed into the tester from the outside by a robot or manually when the tester is to be calibrated. However, the auxiliary device of the present disclosure can be the golden wafer. That is, in the present disclosure, the golden wafer can be placed in the drawer 35 of the storage container 30, such that the conveying device 40 can convey the golden wafer from the storage container 30 to the chuck 10 to facilitate the calibration process of the tester.

Similarly, the auxiliary device of the present disclosure can be an isolation substrate (e.g., an isolation structure). That is, the isolation substrate can also be placed in the drawer 35 of the storage container 30. When leakage detection is to be performed, the isolation substrate can be directly conveyed to the chuck 10 by the conveying device 40, instead of using the robot or manual labor to feed the isolation substrate from the outside into the tester, thereby facilitating the leakage detection process.

In one embodiment, the auxiliary device can be a cleaning sheet, which can be applied to a needle cleaning step before testing the test sample W or after the test step is carried out for some time. In the present embodiment, the auxiliary device can be the cleaning sheet of different types, such as an abrasive cleaning sheet (i.e., with a structure similar to sandpaper or brushes) and an adhesive cleaning sheet. In addition, the cleaning sheets of different types for different needle cleaning needs can be placed simultaneously in the drawers 35 of the storage container 30.

In addition, after the test sample W is tested, the temperature of the test sample W may be higher or lower due to different test conditions, and directly placing the test sample W back into the wafer cassette 50 may cause damage to the wafer cassette 50. However, the storage container 30 of the present disclosure can be made of a high-temperature material or a low-temperature material. In the present disclosure, the test sample W that is tested can be placed in the drawer 35 of the storage container 30 until the temperature of the test sample W returns to a temperature suitable for placing the test sample W back into the wafer cassette 50. The storage container 30 of the present disclosure will be described in detail below.

Figure 4:
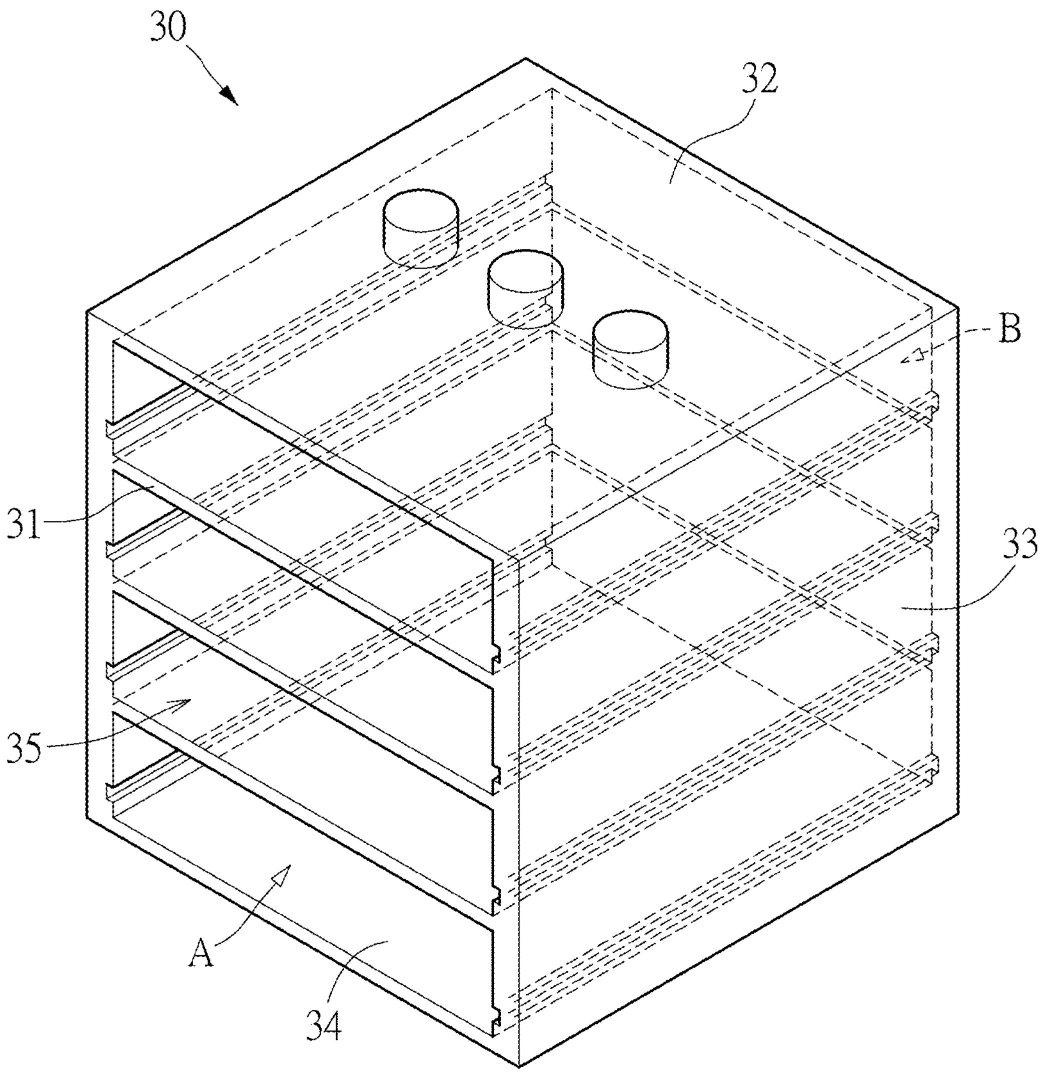
FIG. 4 is a schematic perspective view of a storage container according to the present disclosure.

Further, the present disclosure also provides the storage container 30 for the wafer tester 100. Reference is made to FIG. 4, in which a schematic perspective view of the storage container 30 of the present disclosure is shown. The storage container 30 of the present disclosure can include a frame 31, a top plate 32, a side wall 33, and a bottom plate 34, such that a plurality of drawers 35 for carrying the test samples W or the auxiliary devices are formed in the storage container 30. In addition, each drawer 35 can independently have a first opening A and a second opening B. The conveying device 40 can remove the test sample W placed on the chuck 10 and convey the test sample W to the storage container 30, and place the test sample W into the storage container 30 through the first opening A of the storage container 30 for temporary storage so that other processing can be performed on the chuck 10 during the temperature recovery of the test sample W.

In one embodiment, during the temperature recovery of the test sample W, the conveying device 40 can remove the auxiliary device placed in the drawer 35 of the storage container 30 from the first opening A and convey the auxiliary device onto the chuck 10 to clean the probes of the probe card 20. That is, the first opening A is an opening that allows the test sample W or the auxiliary device to move out or into the storage container 30. The first opening A is arranged on one side of the storage container 30, and the second opening B is arranged on another side of the storage container 30 with respect to the first opening A. For example, the second opening B can be oriented toward an exterior of the wafer tester 100 to facilitate an operator to replace the auxiliary device. In a condition that the probe card 20 does not need to be cleaned yet, during the temperature recovery of the test sample W, the conveying device 40 can remove another test sample W from the wafer cassette 50 and convey the another test sample W onto the chuck 10 to perform the testing on the another test sample W.

Further, the storage container 30 can be made of a metal material. In addition, the storage container 30 can be made of a highly thermally conductive material having a thermal conductivity greater than 1.4 W/m·K, e.g., 1.45 W/m·K, 1.5 W/m·K, 1.55 W/m·K, 1.6 W/m·K, 1.65 W/m·K, 1.7 W/m·K, and 1.8 W/m·K.

Generally, the test temperature range for wafer reliability testing is about 125° C. to 300° C. in the high-temperature range and about −40° C. to −60° C. in the low-temperature range. For certain specific materials (e.g., superconducting materials), the test temperature can reach as low as −150° C.

In one embodiment, the storage container 30 can be made of the high-temperature material, e.g., a high-temperature material capable of withstanding 125° C. Preferably, the storage container 30 can be made of a high-temperature capable of withstanding temperatures up to 300° C., i.e., the storage container 30 can withstand temperatures ranging from 125° C. to 300° C. or even above 300° C., such as 125° C., 150° C., 160° C., 170° C., 180° C., 190° C., 200° C., 210° C., 220° C., 230° C., 240° C., 250° C., 260° C., 270° C., 280° C., 290° C., and 300° C. In some embodiments, the storage container 30 can withstand temperatures even above 300° C.

In another embodiment, the storage container 30 can be made of the low-temperature material, e.g., a low-temperature material capable of withstanding temperatures below 0° C. Preferably, the storage container 30 can be made of a low-temperature material capable of withstanding temperatures as low as −150° C., e.g., 0° C., −10° C., −20° C., −30° C., −40° C., −50° C., −60° C., −70° C., −80° C., −90° C., −100° C., −110° C., −120° C., −130° C., −140° C., and −150° C. In some embodiments, the storage container 30 can withstand temperatures even lower than −150° C.

Therefore, after the test sample W is tested, the test sample W can be conveyed directly to the drawer 35 of the storage container 30 by using the conveying device 40, and the auxiliary device can be moved to the chuck 10 to clean the needles. Accordingly, there is no need to wait for the temperature recovery of the test sample W, thereby reducing an overall testing time. Preferably, the storage container 30 can be made of a material that is resistant to both low-temperature and high-temperature.

One of the beneficial effects of the present disclosure is that in the wafer tester and the storage container for the wafer tester, by virtue of "the storage container including the plurality of drawers configured for carrying the test sample or the auxiliary device" and "the conveying device conveying the test sample or the auxiliary device between the chuck and the storage container," testing efficiency of the wafer tester can be improved.

Further, since the wafer tester of the present disclosure includes the storage container with multiple drawers and high temperature resistance, the test sample on the chuck can be replaced immediately with only one conveying device, and waiting for the previous test sample to cool or recover for the probe cleaning can be eliminated, thereby reducing the overall testing time.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wafer tester for testing a test sample from a wafer cassette, the wafer tester comprising:
   a chuck;
   a probe card disposed above the chuck with respect to the chuck;
   a storage container including a plurality of drawers, the plurality of drawers being configured for carrying the test sample or an auxiliary device; and
   a conveying device configured for conveying the test sample or the auxiliary device among the chuck, the storage container, and the wafer cassette;
   wherein the chuck is configured to carry one of the test sample and the auxiliary device.

2. The wafer tester according to claim 1, wherein the conveying device removes the test sample from the chuck to unload the test sample from the chuck, and the conveying device conveys the test sample directly to the drawer of the storage container.

3. The wafer tester according to claim 1, wherein the conveying device takes the auxiliary device from the drawer of the storage container, and conveys the auxiliary device to the chuck.

4. The wafer tester according to claim 1, wherein the auxiliary device is a cleaning sheet, a golden wafer, or an isolation substrate.

5. The wafer tester according to claim 1, wherein the storage container is made of a low-temperature material capable of withstanding at least −40° C.

6. The wafer tester according to claim 1, wherein the storage container is made of a highly thermally conductive material having a thermal conductivity greater than 1.4 W/m·K (Watts per meter Kelvin).

7. The wafer tester according to claim 6, wherein the storage container is made of a high-temperature material capable of withstanding at least 125° C. (degrees Celsius).

8. The wafer tester according to claim 6, wherein the storage container is made of a metal material.

9. The wafer tester according to claim 1, wherein each of the plurality of drawers of the storage container has a first opening and a second opening that are arranged opposite to each other, the conveying device conveys the test sample or the auxiliary device through the first opening, and the second opening is configured for replacing the auxiliary device.

10. A storage container for use in the wafer tester as claimed in claim 1, the storage container comprising:

a plurality of drawers for carrying the test sample or the auxiliary device, and each independently having:

a first opening configured for taking the test sample or the auxiliary device from the storage container or putting the test sample or the auxiliary device into the storage container; and a second opening arranged opposite to the first opening and configured for replacing the auxiliary device.

* * * * *